US010528070B2

(12) United States Patent
Coln et al.

(10) Patent No.: US 10,528,070 B2
(45) Date of Patent: Jan. 7, 2020

(54) POWER-CYCLING VOLTAGE REFERENCE

(71) Applicant: Analog Devices Global Unlimited Company, Hamilton (BM)

(72) Inventors: Michael C. W. Coln, Lexington, MA (US); Michael Mueck, Andover, MA (US); Quan Wan, Belmont, MA (US); Sandeep Monangi, Srikakulam (IN)

(73) Assignee: Analog Devices Global Unlimited Company, Hamilton (BM)

( * ) Notice: Subject to any disclaimer, the term of this patent is extended or adjusted under 35 U.S.C. 154(b) by 0 days.

(21) Appl. No.: 15/969,175

(22) Filed: May 2, 2018

(65) Prior Publication Data

US 2019/0339730 A1    Nov. 7, 2019

(51) Int. Cl.
*G05F 3/26* (2006.01)
*H03F 1/30* (2006.01)
(Continued)

(52) U.S. Cl.
CPC .......... *G05F 3/262* (2013.01); *H03F 1/0233* (2013.01); *H03F 1/301* (2013.01);
(Continued)

(58) Field of Classification Search
CPC ..... G05F 3/262; H03M 1/1245; H03M 1/466; H03F 3/45179; H03F 1/301
(Continued)

(56) References Cited

U.S. PATENT DOCUMENTS 5,563,504 A    10/1996 Gilbert et al.
5,821,807 A    10/1998 Brooks
(Continued)

FOREIGN PATENT DOCUMENTS

CN    104199509 A    12/2014
CN    107066008 A    8/2017
(Continued)

OTHER PUBLICATIONS

"Ultralow Noise, LDO XFET Voltage References with Current Sink and Source", Analog Devices Data Sheet—ADR440/ADR441/ADR443/ADR444/ADR445, (2016), 18 pgs.
(Continued)

*Primary Examiner* — Brian K Young
(74) *Attorney, Agent, or Firm* — Schwegman Lundberg & Woessner, P.A.

(57) ABSTRACT

A low-noise, low-power reference voltage circuit can include an operational transconductance amplifier (OTA) with inputs coupled to a temperature-compensated voltage, such as can be provided by source-coupled first and second field-effect transistors (FETs) having different threshold voltages. A capacitive voltage divider can feed back a portion of a reference voltage output by the OTA to the inputs of the OTA to help establish or maintain the temperature-compensated voltage across the inputs of the OTA. A switching network can be used, such as initialize the capacitive voltage divider or other capacitive feedback circuit, such as during power-down cycles, or when resuming powered-on cycles. A switch can interrupt current to the OTA during the power-down cycles to save power. The cycled voltage reference circuit can provide a reference voltage to an ADC reservoir capacitor. Powering down can occur during analog input signal sampling, during successive approximation routine (SAR) conversion, or both.

26 Claims, 5 Drawing Sheets

(51) Int. Cl.
  *H03F 1/02* (2006.01)
  *H03F 3/45* (2006.01)
  *H03M 1/12* (2006.01)
  *H03M 1/46* (2006.01)

(52) U.S. Cl.
  CPC ...... *H03F 3/45179* (2013.01); *H03M 1/1245* (2013.01); *H03M 1/466* (2013.01); *H03F 2200/156* (2013.01); *H03F 2200/231* (2013.01); *H03F 2200/234* (2013.01); *H03F 2200/267* (2013.01); *H03F 2203/45031* (2013.01); *H03F 2203/45116* (2013.01); *H03F 2203/45352* (2013.01); *H03F 2203/45514* (2013.01)

(58) Field of Classification Search
  USPC ................................................ 341/161, 155
  See application file for complete search history.

(56) References Cited

U.S. PATENT DOCUMENTS

| | | | |
|---|---|---|---|
| 5,867,012 | A | 2/1999 | Tuthill |
| 6,356,161 | B1 | 3/2002 | Nolan et al. |
| 6,853,238 | B1 | 2/2005 | Dempsey et al. |
| 6,885,178 | B2 | 4/2005 | Marinca |
| 7,342,390 | B2 | 3/2008 | Tachibana et al. |
| 7,598,799 | B2 | 10/2009 | Marinca |
| 7,612,606 | B2 | 11/2009 | Marinca |
| 7,683,701 | B2 | 3/2010 | Georgescu et al. |
| 7,714,563 | B2 | 5/2010 | Marinca |
| 8,008,966 | B2 * | 8/2011 | Cho ............ G05F 3/30 323/313 |
| 8,258,854 | B2 | 9/2012 | Pan |
| 8,717,090 | B2 | 5/2014 | Marinca et al. |
| 8,931,953 | B2 | 1/2015 | Law et al. |
| 9,748,969 | B1 | 8/2017 | Bach et al. |
| 9,857,814 | B2 | 1/2018 | Cohen et al. |
| 9,971,376 | B2 * | 5/2018 | Lee ............ G05F 3/262 |
| 9,977,111 | B2 * | 5/2018 | Li ............ G05F 3/02 |
| 10,037,045 | B2 * | 7/2018 | Wan ............ G05F 1/463 |
| 10,409,312 | B1 | 9/2019 | Rajasekhar |
| 2004/0124822 | A1 | 7/2004 | Marinca |
| 2008/0074172 | A1 | 3/2008 | Marinca |
| 2009/0243708 | A1 | 10/2009 | Marinca |
| 2010/0301832 | A1 | 12/2010 | Katyal et al. |
| 2011/0084681 | A1 | 4/2011 | Herbst |
| 2011/0200070 | A1 | 8/2011 | Makinwa et al. |
| 2012/0169413 | A1 | 7/2012 | Choi |
| 2013/0099955 | A1 | 4/2013 | Shaeffer et al. |
| 2015/0323950 | A1 | 11/2015 | Marinca et al. |
| 2017/0255221 | A1 | 9/2017 | Marinca et al. |
| 2018/0074533 | A1 | 3/2018 | Kamath et al. |

FOREIGN PATENT DOCUMENTS

| | | |
|---|---|---|
| CN | 107908220 A | 4/2018 |
| WO | WO-2004077192 A1 | 9/2004 |

OTHER PUBLICATIONS

Filanovsky, I. M., et al., "0.6-V Supply Voltage References for CMOS Technology Based on Threshold-Voltage-Difference Architecture", IEEE, (2005), 1790-1793.

Magnelli, Luc, et al., "A 2.6 nW, 0.45 V Temperature—Compensated Subthreshold CMOS Voltage Reference", IEEE Journal of Solid-State Circuits, 46, 2, (Feb. 2011), 465-474.

Song, Ho-Jun, et al., "A Temperature-Stabilized SO1 Voltage Reference Based on Threshold Voltage Difference Between Enhancement and Depletion NMOSFET'ss", IEEE Journal of Solid-State Circuits, vol. 28, No. 6, (Jun. 1993), 671-677.

Toledo, Luis, et al., "A new CMOS voltage reference scheme based on a new CMOS voltage reference scheme based on Vth-difference principle", IEEE, (2007), 3840-3843.

U.S. Appl. No. 16/040,207/U.S. Pat. No. 10,310,538, filed Jul. 19, 2018, Low Power Duty-Cycled Reference.

"U.S. Appl. No. 16/040,207, Non Final Office Action dated Nov. 19, 2018", 7 pgs.

"U.S. Appl. No. 16/040,207, Response filed May 16, 2019 to Non Final Office Action dated Nov. 19, 2018", 10 pgs.

Atkinson, Nicholas M., "System-Level Radiation Hardening of Low-Voltage Analog/Mixed-Signal Circuits", Ph.D Dissertation, Vanderbilt University, (Dec. 2013), 230 pgs.

Basyurt, Pinar Basak, "Fully Integrated Voltage Reference Circuits", Ph.D Thesis, Istanbul Technical University, (Apr. 2014), 172 pgs.

Lee, Anders Wen-Dao, "The Design of a High Precision, Wide Common Mode Range Auto-Zero Comparator", MEng. Thesis, MIT, (Jun. 2015), 90 pgs.

Liu, Maoqiang, et al., "15.4 A 0.8V 10b 80kS/s SAR ADC with Duty-Cycled Reference Generation", IEEE ISSCC, Data-Converter Techniques, 15.4, (Feb. 2015), 3 pgs.

Mercer, D., "Voltage References", Analog Devices Wiki, Intro to Electronics I and II, Ch. 14, URL: https://wiki.analog.com/university/courses/electronics/text/chapter-14?rev=1380480718, (accessed Jul. 25, 2018), 9 pgs.

Souri, Kamran, et al,, "A 0.12 mm2 7.4 m W Micropower Temperature Sensor With an Inaccuracy of 0.2 C (3 s) From −30 C to 125 C", IEEE Journal of Solid-State Circuits, vol. 46, No. 7, (Jul. 2011), 8 pgs.

Souri, Kamran, et al., "A CMOS Temperature Sensor With a Voltage-Calibrated Inaccuracy of 0.15 C (3) From 55 C to 125 C", IEEE, (Jan. 2013), 10 pgs.

"U.S. Appl. No. 16/040,207, Notice of Allowance dated Jun. 3, 2019", 5 pgs.

"European Application Serial No. 19172015.0, Extended European Search Report dated Oct. 9, 2019", 8 pgs.

* cited by examiner

POWER-CYCLING VOLTAGE REFERENCE

TECHNICAL FIELD

This document pertains generally, but not by way of limitation, to integrated circuits and more particularly, but not by way of limitation, to a voltage reference circuit and methods of making or using the same.

BACKGROUND

A precision voltage reference circuit can be useful in many signal-processing or other electronic applications. For example, a precision analog-to-digital converter (ADC) circuit can use a precision voltage reference circuit for comparing a component of an input voltage signal to the generated reference voltage for the analog-to-digital conversion.

SUMMARY

One approach to providing a voltage reference, such as in a successive approximation routine (SAR) or other ADC is to provide a bandgap reference voltage core circuit to generate proportional-to-absolute-temperature (PTAT) quantity that can be summed with an appropriate complementary-to-absolute-temperature (CTAT) quantity to generate a temperature-compensated bandgap reference voltage. The bandgap voltage can include noise filtering, such as to limit the integrated noise produced by the bandgap reference voltage core circuit. A voltage buffer can be included, such as to provide sufficient reference current to maintain the reference voltage at a terminal of a large off-chip bypass capacitor, such as to deliver an appropriate reference charge during bit-trials of the ADC.

The present inventors have recognized, among other things, that power-cycling a voltage reference circuit can be desirable, such as for portable or other battery-powered electronic devices or for other low-power applications. Power-cycling can include powering down the voltage reference circuit during time periods when it is not being used by an ADC or other auxiliary circuit, and powering the voltage reference circuit back up when it is needed for use by the ADC or other auxiliary circuit. However, power-cycling itself may be energy expensive in certain respects. For example, a low-pass filtered voltage reference circuit may require an appreciable amount of energy to restore the filter-state upon being powered back up after being powered down to save energy. While low-pass filtering may limit noise upon the voltage reference, powering back up a low-pass filtered voltage reference circuit may require a considerably longer-settling time before the voltage reference is available for use, as compared to leaving the voltage reference circuit in a powered-on state. This longer settling time may consume more total energy, thereby diminishing the benefit of the low-pass filtering when it is used in combination with such power cycling. When the voltage reference includes an off-chip or other large bypass capacitor, such as to provide adequate charge to the ADC during analog-to-digital conversion while maintaining a stable reference voltage, discharging the bypass capacitor during power-down and re-charging the bypass capacitor again during power-up can also demand considerable energy. For example, for a 1 microFarad bypass capacitor, across which a 2V reference voltage is being maintained, discharging the bypass capacitor during power-down and again charging the bypass capacitor upon power-up would consume 2 microJoules, which can be 100 times more electrical energy consumed than the actual electrical energy consumed by the analog-to-digital conversion itself.

The present inventors have recognized that some of these problems can be solved or ameliorated, such as by using a different architecture for providing a voltage reference, such as described herein, and that such an approach can optionally be used in combination with an ADC architecture that uses a reference reservoir capacitor, rather than a larger off-chip reference bypass capacitor. For example, a reference voltage circuit can include an operational transconductance amplifier (OTA), such as can have inputs coupled to a temperature-compensated voltage, such as can be provided by source-coupled first and second field-effect transistors (FETs) having different threshold voltages. Capacitive feedback, such as a capacitive voltage divider, can be used to feedback a portion of a reference voltage output by the OTA to the inputs of the OTA, such as to help establish or maintain the temperature-compensated voltage across the inputs of the OTA. The capacitive voltage divider can use relatively small on-chip capacitors, such as can be power-cycled without incurring excessive energy expenditures. A switching network can be used, such as initialize the capacitive voltage divider or other capacitive feedback circuit, such as during power-down cycles. The switching network can also include a switch that can be used to interrupt current to the OTA during the power-down cycles, such as to save power. The cycled voltage reference circuit can be used to provide a reference voltage to a reservoir capacitor of an ADC, and can be power cycled such as to be powered-down when the ADC circuit is performing an analog-to-digital conversion using the reference voltage stored on the reservoir capacitor.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
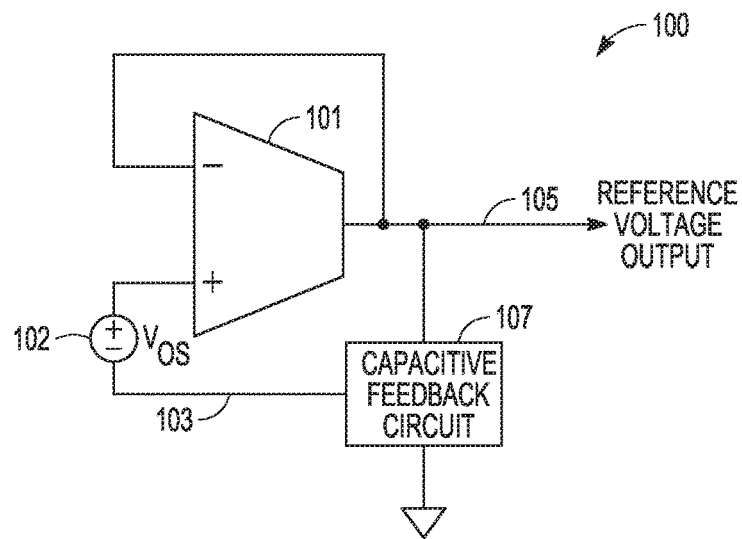
FIG. 1 is a schematic diagram illustrating an example of portions of a voltage reference circuit.

FIG. 1 is a schematic diagram illustrating an example of portions of a voltage reference circuit 100. The voltage reference circuit 100 can include an amplifier 101, such as an operational transconductance amplifier (OTA). A temperature compensated offset voltage, $V_{OS}$, 102 can be provided to or generated at the non-inverting input of the amplifier 101 such as shown. Although the offset voltage $V_{OS}$ 102 is illustrated outside of the amplifier 101, it can instead be generated within the amplifier 101, such as explained further herein. An inverting input of the amplifier 101 can be electrically coupled to an output node 105. A capacitive feedback circuit 107 can be electrically coupled between the output node 105 and the non-inverting input, at node 103, of the amplifier 101. The temperature-compensated offset voltage $V_{OS}$ 102 at the non-inverting input of the amplifier 101 can be used to generate a temperature-compensated reference voltage at the output node 105, such as explained herein.

Figure 2:
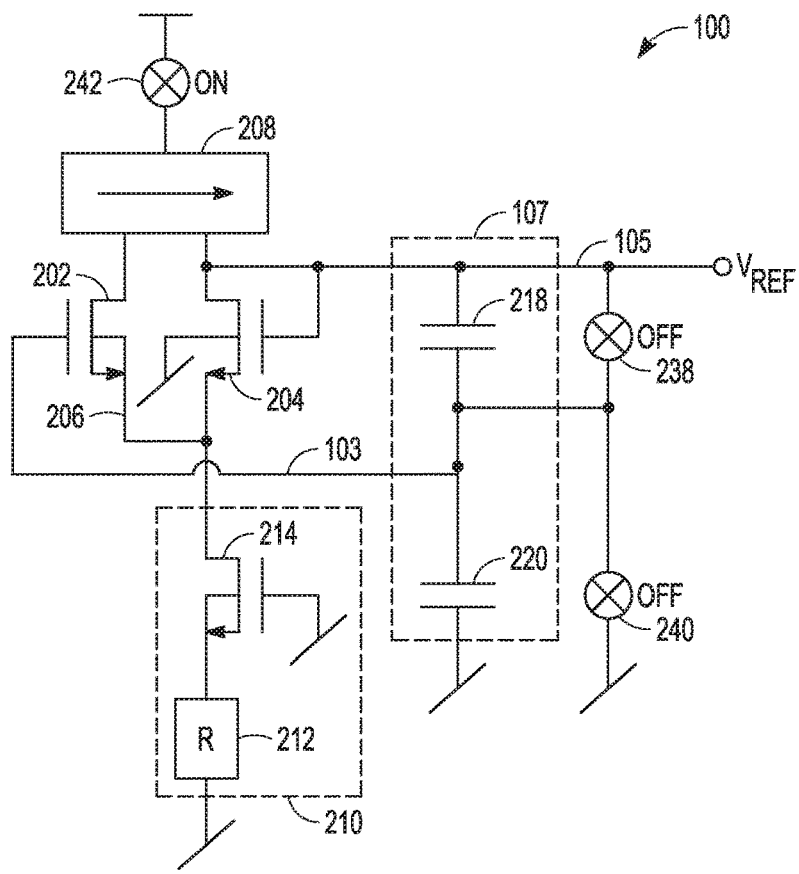
FIG. 2 is a schematic diagram illustrating an example of portions of the voltage reference circuit in more detail.

FIG. 2 is a schematic diagram illustrating an example of portions of the voltage reference circuit 100 in more detail. In this example, the amplifier 101 can include an OTA that can include input transistors that can generate a transconductance. Such input transistors of the OTA can include a first field-effect transistor (FET) 202 and a second FET 204. In an illustrative example, FETs 202, 204 can include n-channel FETs, such as shown in the example of FIG. 2. Source terminals of the amplifier input FETs 202, 204 can be interconnected, such as at a common-source node 206. Drain terminals of the FETs 202, 204 can respectively be coupled to a current mirror circuit 208, such as can be used to provide like currents to each of the FETs 202, 204. A current sink circuit 210 can be coupled to the common-source node 206, such as to sink the combined current from the FETs 202, 204. In an example, the current sink circuit 210 can include a resistor 212, such as to provide the current sink function, or can additionally or alternatively include a current sink transistor, such as the current sink FET 214. If included, the current sink FET 214 can include a depletion mode (e.g., negative threshold voltage) FET or a native mode (e.g., zero or very small positive threshold voltage FET). Such depletion or native mode devices can be turned on without requiring that a positive gate voltage be provided—which can help the OTA operate appropriately even when being powered-on, such as during recurrent power-ons when power-cycling the voltage reference circuit 100.

A capacitive feedback circuit 107 can be included, such as can provide capacitive feedback from the output node 105, at which the reference voltage is provided, back to one or more the inputs of the OTA, which can be located at one of the gate terminals of the FETs 202, 204. For example, the capacitive feedback circuit 107 can include a capacitive voltage divider. The capacitive voltage divider can include capacitors 218, 220, which can he in series with each other between the output node 105 and a reference node, such as a ground node such as shown in FIG. 2. An intermediate node 103 between the interconnected terminals of the capacitors 218, 220, can be electrically coupled to an input of the amplifier 101, such as to the non-inverting input of the OTA, such as by being electrically connected to a gate terminal of the first FET 202. The second FET 204 can be diode-connected, such as shown in FIG. 2, such as with its gate terminal electrically connected to its drain terminal at the output node 105.

A switching network can be provided, such as to help provide power-cycling capability of the voltage reference circuit 100. The switching network can include switches 238, 240, such as can respectively shunt corresponding capacitors 218, 220. Switches 238, 240 can be turned on during power-down of the voltage reference circuit 100, such as when power-cycling. This can help initialize the capacitive divider circuit, such as during recurrent power-downs. The switching network can also include one or more switches 242, such as can be turned-off during the power-down cycle of the voltage reference circuit 100, such as to interrupt current to the OTA, including to the current mirror 208, to the FETS 202, 204, and to the current sink 210. This can help save power during such recurring power-downs of the voltage reference circuit 100.

When not powered down, that is, during a normal operating mode between power-downs of the power-cycling, the switch 242 can be on and the switches 238, 240 can be off. At the intermediate node 103, the capacitive divider can feed back a portion of the reference voltage generated at the output node 105 to the gate terminal of the first FET 202, which can serve as a non-inverting amplifier input of the OTA. FETs 202, 204 can be configured with intentionally-mismatched different threshold voltages, $V_T$, such as by introducing a different quantity of one or more dopants into the channel region of FET 202 than is introduced into the channel region of FET 204. This can be accomplished during a manufacturing process that allows selectively adjusting channel dopants to selectively adjust FET thresholds (e.g., via separate selective ion-implantation steps) to obtain different FET thresholds, $V_T$, or via another threshold-establishing or threshold-adjusting technique. With the capacitive feedback such as shown, the temperature-compensated offset voltage, $V_{OS}$, 102 will be created between the gates of the FETs 202, 204 to accommodate their different threshold voltages, $V_T$, while maintaining like drain-source currents through the FETs 202, 204, as provided by the current mirror circuit 208. This offset voltage, $V_{OS}$, 102 across the amplifier inputs at the gates of the FETs 202, 204 will be temperature-compensated, which is an property of it being generated by FETs having different threshold voltages, $V_T$. Thus, the resulting reference voltage generated at the output node 105, will also be temperature compensated, which can be desirable for many applications.

Figure 3:
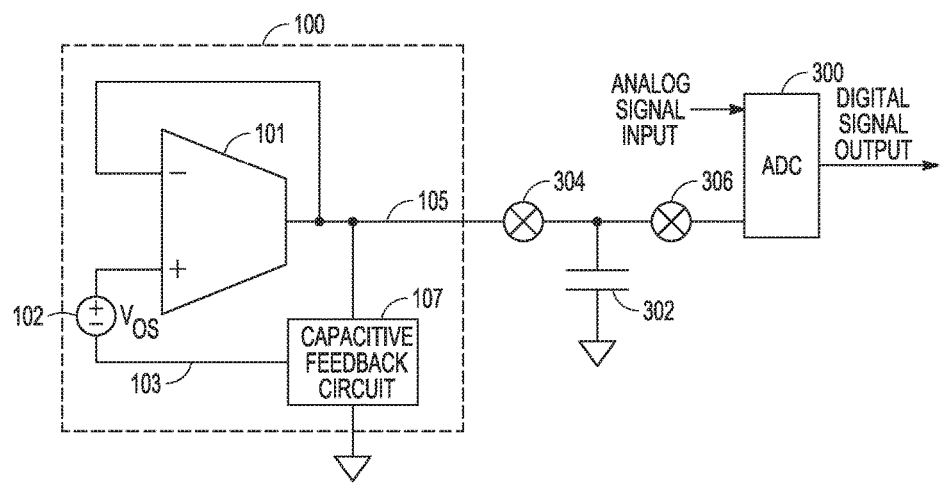
FIG. 3 shows an example in which the reference voltage circuit is coupled at the output node to a reservoir capacitor of a subsequent ADC circuit.

FIG. 3 shows an example in which the reference voltage circuit 100 is coupled at the output node 105 to a reservoir capacitor 302 of a subsequent ADC circuit 300. When the voltage reference circuit 100 is coupled at the output node 105 to a reservoir capacitor 302 of a subsequent ADC circuit 300, the only excess noise introduced by the voltage reference circuit 100 onto the downstream reservoir capacitor is the kT/C sampling noise of the capacitors 218, 220, and 302. The capacitive feedback circuit 107 that includes the capacitive voltage divider circuit can be advantageous in that it allows use of the OTA topology, such as shown in FIG. 2. If a resistive voltage divider circuit were used, instead of the capacitive divider circuit such as shown in FIG. 2, the resistors of such a resistive voltage divider circuit would load the OTA output at node 105. Such a resistive voltage divider approach would consume more power and contribute more noise (e.g., including thermal noise of the resistors) onto the reference voltage generated at the output node 105. This can be avoided using the capacitive feedback approach, such as the capacitive feedback circuit 107 and its capacitive voltage divider circuit approach, such as shown in FIG. 2. The initial conditions on the capacitors 218, 220 can be restored on each power-down, such as by turning the switches 238, 240 on. Turning the switches 238, 240 on can electrically couple each terminal of the capacitors 218, 220, including the intermediate node 103, to a specified reference voltage (e.g., a ground node) during a power-down mode of the power-cycling. The kT/C noise of the capacitors 218, 220 need not dominate the overall noise characteristic of a downstream ADC circuit 300 (FIG. 3) using the voltage reference circuit 100, such as when the series capacitance value of the capacitive divider circuit formed of series of the capacitors 218, 220 is the same as, is similar to, or is of the same order as the capacitance value of a downstream reservoir capacitor 302 (FIG. 3) being supplied by the voltage-reference circuit 100 at the output node 105, which, in turn, can be used by the further downstream ADC circuit 300, such as shown in FIG. 3, with switches 304, 306 that can be used to selectively couple and decouple the reservoir capacitor 302 to the voltage reference circuit 100 (such as during its powered-up operational mode) and to the ADC 300, such as when a reference charge is needed by the ADC for performing bit-trials for digitizing the analog signal input value into a digital signal output value.

As explained herein, the different FET threshold voltages, $V_T$, can be used to generate a temperature compensated offset voltage $V_{OS}$ 102, which, in turn, can be used to generate a temperature compensated reference voltage at the output node 105 of the reference voltage circuit 100. Implanting different FET channel dopants is merely one way of obtaining different FET threshold voltages, $V_T$, such as for generating a temperature compensated input offset voltage, $V_{OS}$, 102 that can be used, in turn, to generate a temperature-compensated reference voltage at the output node 105. Such implanting different channel dopants to obtain different FET threshold voltages can offer an advantage in that such dopant implantation is relatively insensitive to temperature variation during the operation of the reference voltage circuit 100. However, other techniques can be used to obtain different threshold voltages, $V_T$, for the FETs 202, 204. For example, FETs 202, 204 can use different gate materials from each other. For example, one of FETs 202, 204 can include a polysilicon gate, and the other of FETs 202, 204 can use a metal gate. In an example, the FETs 202, 204 can be configured with different work functions, such as with both of FETs 202, 204 including polysilicon gates, but with different doping of such gates as between the two FETs 202, 204. In an example, different dielectric materials or dielectric material thicknesses, or both, can be used as between the two FETs 202, 204, such as to obtain the different threshold voltages, $V_T$. A hot-carrier injection technique can be used to provide the different FET threshold voltages, or one of the FETs 202, 204 can include a lightly-doped drain or lightly-doped source region, or both, so as to be different from the other of the FETs 202, 204, so as to provide different effective threshold voltages, $V_T$, between the FETs 202, 104. In an example, a back-gate effect can be used to obtain the different threshold voltages of the FETs 202, 204, such as by biasing the body terminal of one of the FETs 202, 204 at a different voltage potential than the body terminal of the other of the FETs 202, 204. If such a back-gate effect is used for such biasing to obtain the different threshold voltages, such as by biasing the body terminal of only one of the FETs 202, 204 at a node other than ground, it may be desirable to select such biasing node to be within the capacitive feedback loop shown in FIG. 2, such as to help avoid introducing another power-supply sensitivity that could degrade or otherwise affect a noise performance of the voltage reference circuit 100.

The temperature compensated input offset voltage $V_{OS}$ 102 to the amplifier 101 of the voltage reference circuits contemplated herein, can be provided by junction FETs (JFETs), "metal-oxide" semiconductor FETs (e.g., "MOSFETs"—which need not include a metal gate (e.g., could use a polysilicon or other gate) and which need not include an "oxide" gate dielctric (e.g., could use silicon nitride or another gate dielectric)) or other FET types. The temperature compensated input voltage to the amplifier 101 could be provided by a bandgap-type arrangement, such as can generate proportional-to-absolute-temperature (PTAT) quantity that can be summed with an appropriate complementary-to-absolute-temperature (CTAT) quantity to generate a temperature-compensated bandgap reference voltage. The transistors providing the temperature-compensated input offset voltage $V_{OS}$ 102 need not be part of the OTA or other amplifier 101 circuit used in the voltage reference circuit, such as shown in FIG. 2, but such a temperature-compensated input reference voltage can instead be generated or provided by a separate circuit, if desired. Regardless, a capacitive feedback arrangement, such as shown in FIGS. 1-2, can help accommodate power-cycling, without consuming excess power upon recurrent start-ups, and without contributing excess noise onto the reference voltage being generated and output from the voltage reference circuit 100.

Figure 4:
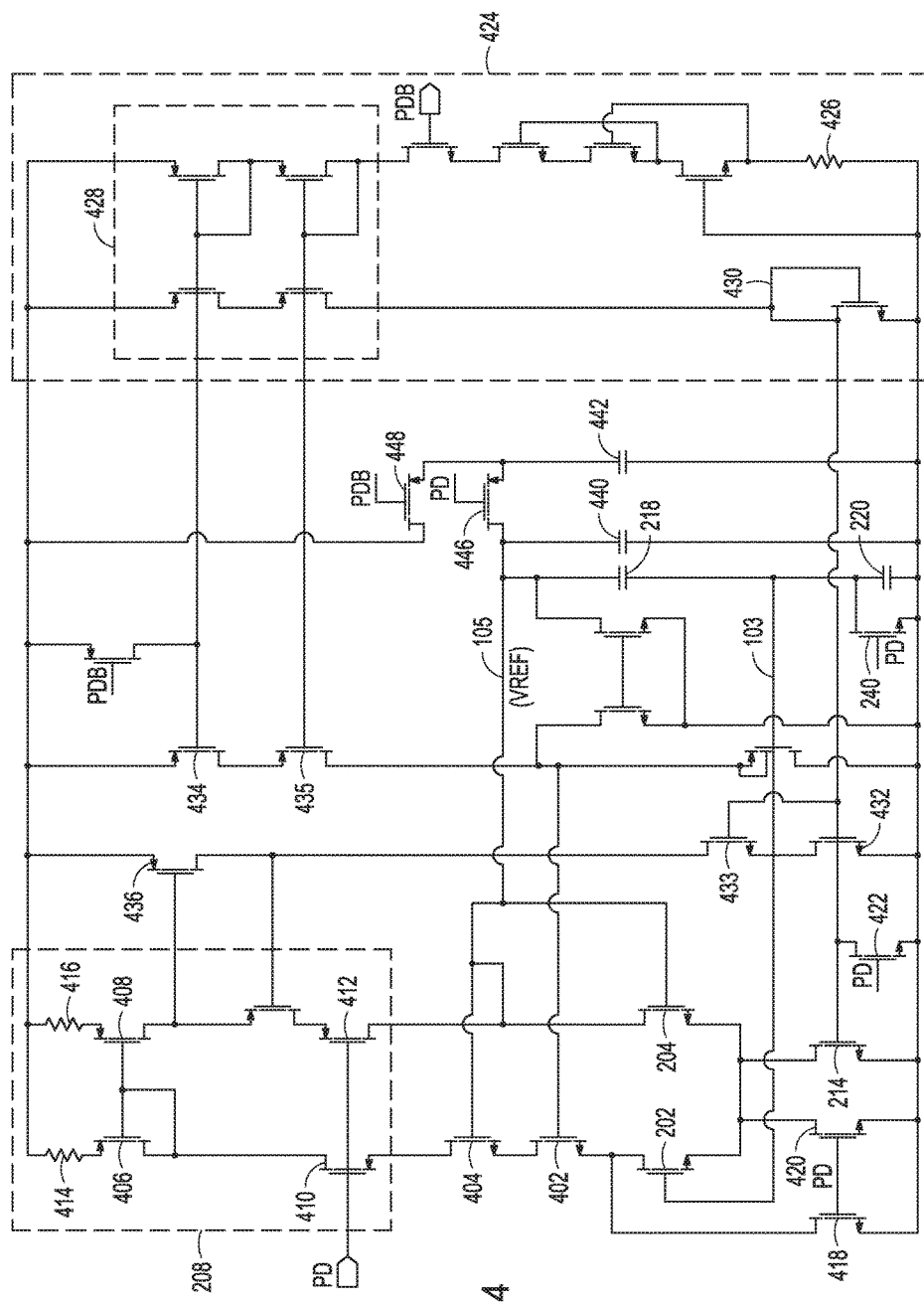
FIG. 4 is a schematic of a more detailed example of portions of the voltage reference circuit, together with some other circuitry, such as can be useful for running a computer simulation to check or characterize the performance of the voltage reference circuit.

FIG. 4 is a schematic of a more detailed example of portions of the voltage reference circuit 100, together with some other circuitry, such as can be useful for running a computer simulation to check or characterize the performance of the voltage reference circuit. In the example of FIG. 4, the input FETs 202, 204 of the amplifier are similarly connected in a common source configuration, with the drain of FET 204 electrically connected to the output node 105 to provide an output reference voltage, VREF. The drain of FET 202 can be electrically coupled to the current mirror circuit 208, such as via cascade FETs 402, 404, both of which can be in series with each other and with the drain of FET 202, and each of which can help improve an output conductance of the FET 402. The current mirror circuit 208 can include current mirror FETs 406, 408 such as with cascade FETs 410, 412, all of which are shown as p-channel FETs, in this example. The current mirror FETs 406, 408 can be gain-degenerated, such as by including gain-degeneration resistors 414, 416 between their respective source terminals and a positive power supply voltage node, VDD. The current sink circuit 210, coupled to the sources of FETs 202, 204, can include a current sink FET 214, with FETs 418, 420 that can be included such as to operate as switches that can be turned on during power-down cycles, such as to respectively couple the source and drain nodes of FET 202 to a reference voltage, such as a ground voltage, during the power-down cycles. Similarly, a FET 422 can be included, such as to operate as a switch that can be turned on during power down cycles, such as to couple the gate terminal of the current sink FET 214 to the reference voltage, such as a ground node.

In FIG. 4, a current source circuit 424 is included, such as to provide currents to the voltage reference circuit 100, such as for simulation or implementation purposes. In the current source circuit 424, a reference current can be generated via the resistor 426 and mirrored by the cascoded current mirror circuit 428, such as to a set diode-connected FET 430, which can be further mirrored by FET 214 and cascoded FET 432 such as shown, or to establish appropriate bias voltages such as for establishing a current through cascoded FET 434, The current through the cascoded FET 432 can be fed via its cascode FET 433 to a load FET, such as to establish an appropriate gate voltage at the drain of FET 436 to bias a gate terminal of the cascode FET 412. Other FETs can be included to operate as switches that can be switched on or off depending on whether a power-down cycle (PD) is present or is not present (PDB), such as for connecting the nodes to an appropriate reference voltage based on whether a power-down state is or is not present.

Capacitors 440, 442 represent the reservoir capacitor 302 (FIG. 3), and can be configured in this manner to help quickly return the voltages across the series-connected capacitors 218, 220 to their desired values when returning from a powered-down mode to an operational mode. When not in power-down mode, the capacitors 440, 442, can be charged to the reference voltage at node 105 by turning FET 446 on and keeping FET 448 off. Then, during a power-down mode, FET 446 can be turned off and FET 448 can be turned on. This will discharge the voltage across the capacitor 440 along with the voltages across the series-connected capacitors 218, 220, while charging the capacitor 442 to the power supply voltage VDD through the FET 448, which is on during the power-down mode. When returning to normal powered-up operation, therefore, the stored charge resulting from power supply voltage VDD that was stored across the capacitor 442 can be shared with the capacitor 440. This can effectively initialize the output node 105 to a fraction of the supply voltage VDD, e.g., (VDD/2). As a result, the amplifier 101 need only to drive the node voltage at the output node 105 to slew between the fraction of VDD (e.g., (VDD/2)) and VREF to resume normal operation after a power-down, rather than having to slew from the ground voltage (0V) to the reference voltage, VREF. This can allow the reference voltage VREF to be available more quickly when returning from a powered-down state to an operational state.

Additionally or alternatively, the bias current of the OTA or other amplifier 101 can be dynamically-varied during a powered-on mode of operation, such as to dynamically vary its gain or bandwidth. For example, a larger bias current can be provided for a period of time after power-up (e.g., which can provide increased gain such as to help improve slewing or settling performance), then such bias current to the OTA can be tapered or throttled back, such as a specified period of time. This can help save power or can help to dynamically band-limit noise generated by the voltage reference circuit 101. If a multi-stage approach is used, such as with the voltage reference circuit 101 followed by a buffer or amplifier circuit, a similar bandlimiting of gain of the downstream buffer or amplifier circuit can similarly help provide such benefit.

The circuit topology shown in FIG. 4 was used in a computer simulation in which an active power level corresponding to approximately 2 milliamperes of current drawn from the power supply voltage VDD=4.0 Volts was used to drive a 340 picoFarad reservoir capacitor output load capacitance to a VREF=2.5 Volt reference voltage value at the output node 105. Resuming a normal powered-on mode of operation after being in a powered-down mode, the reference voltage at the output node 105 settled to within 3.5 parts per million within about 800 nanoseconds, with such settling becoming relatively linear after about 250 nanoseconds. The switched capacitor addition of the initialization capacitors 440, 442 speeded up the initial slewing of the output node to its intended reference voltage value, VREF, while helping reduce the energy consumption requirements of the amplifier 101. The energy consumption per ADC measurement sampling the reservoir capacitor was simulated to be approximately 8 nanoJoules, which can be compared to an energy-efficient ADC energy consumption of about 10 nanoJoules per ADC conversion. This indicates that the present power-cycling technique and the present reference voltage circuit topology can be made to scale competitively with the downstream ADC circuitry.

Noise performance was also computer simulated over, including integrated 1/f noise over a frequency spectrum from $3 \times 10^9$ Hz to 1/(100 years lifetime). The computer simulation for the approach shown in FIG. 4 yielded a thermal noise component of 13.9 microVolts, a flicker noise component of 6.7 microVolts, and a total noise of 15.5 microVolts, which was can be compared to a total integrated noise of 19.8 microVolts for another computer noise simulation approach being used as comparison.

Temperature drift was also computer simulated, suggesting a drift of about 350 ppm/C, within the limitations of the computer models being used for such temperature drift simulation. Such temperature drift may be acceptable for certain applications, but for applications requiring more stable performance over temperature, a digital correction can be applied, such as using the circuit architecture 500 shown in FIG. 5.

Figure 5:
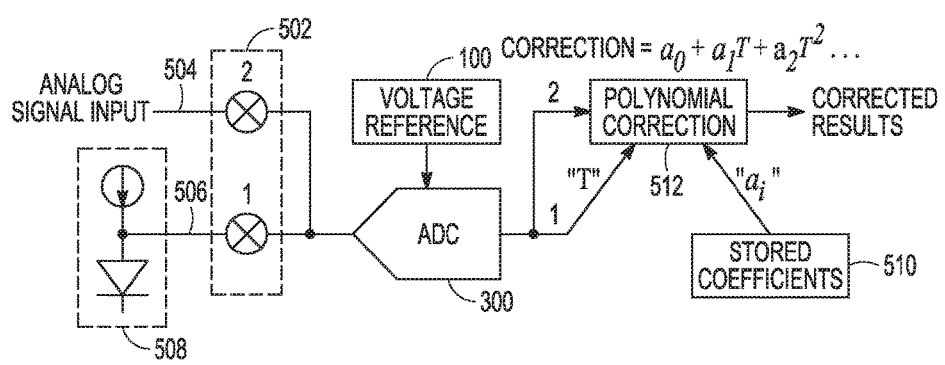
FIG. 5 shows a circuit architecture in which the voltage reference can be included with an ADC, to which it can provide a reference voltage such as for use in analog-to-digital conversion, and which can include digital temperature compensation or correction.

FIG. 5 shows a circuit architecture 500 in which the voltage reference 100 can be included with an ADC 300, to which it can provide a reference voltage such as for use in analog-to-digital conversion. The ADC 300 can be understood to optionally include a reservoir capacitor 302, such as shown in the example of FIG. 3. In FIG. 5, a multiplexer circuit 502 can be used to multiplex between an input analog signal of interest at node 504 to be converted into a digital output signal by the ADC, and an output node 506 from a temperature sensor circuit 508, which can provide an analog temperature-indicating signal to the ADC 300 for conversion into a digital temperature-indicating signal. The temperature sensor circuit 508 can include a proportional-to-absolute temperature (PTAT) generating circuit or a complementary-to-absolute temperature (CTAT) generating circuit, such as can be used in various ways in bandgap voltage reference circuits. Thus, the analog temperature-indicating signal at node 506 can include a PTAT or CTAT signal that, when selected by the multiplexor 502, can he passed to the ADC circuit 300 such as for conversion into a corresponding digital temperature indicating signal, the value of which can be used digitally with stored digital coefficients 510 of a digital polynomial correction factor 512 for correcting the digitized value of the analog signal of interest at node 504 according to the operating temperature of the voltage reference 100 and the ADC 300, such as was sensed using the temperature sensor 508. This can help allow more accurate analog-to-digital conversion of the analog signal of interest at node 504 even if there is some temperature variability in the system, such as can be due to a first-order or higher-order temperature dependence of the voltage reference circuit 100.

In the example of FIG. 5, the power cycling can be operated such that the voltage reference is powered up for a period of time needed to attain a stable reference voltage to be provided for a reservoir capacitor 302 of the ADC circuit 300, either directly or via an intervening active buffer circuit for driving the reservoir capacitor 302.

Figure 6A:
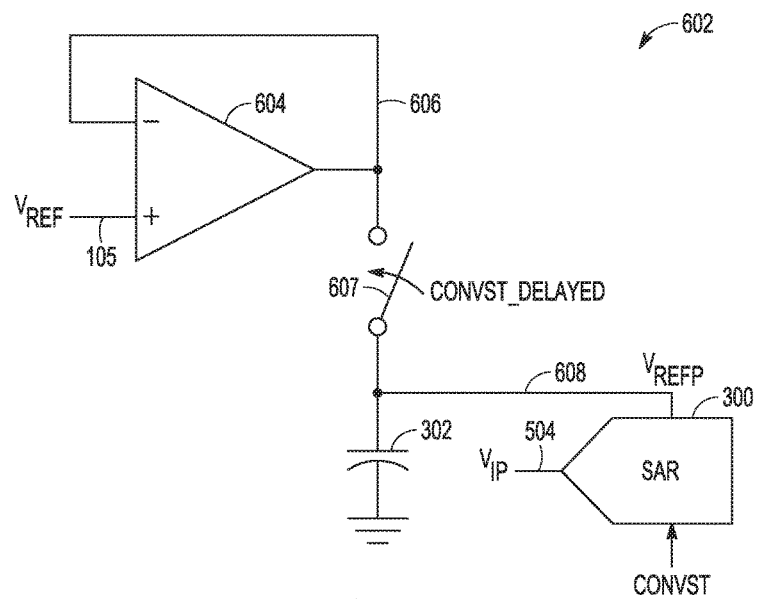
FIG. 6A shows a block diagram of a power-cycled buffer circuit, which can receive the reference voltage provided by the reference voltage circuit, or which can include the power-cycled reference voltage circuit.

FIG. 6A shows a block diagram of a power-cycled buffer circuit 602, which can receive the reference voltage from another reference voltage circuit, or which can include the power-cycled reference voltage circuit 100. In an example, the buffer circuit 602 can include a power-cycled amplifier 604 configured in a unity-gain arrangement, such as with its inverting input coupled to its output at node 606, and with its non-inverting input coupled to receive the reference voltage generated by the power-cycled reference voltage circuit 100 at node 105. A switch 607 can be used to couple and decouple the output node 606 of the buffer amplifier 604 to the reservoir capacitor 302 reference node 608 associated with the SAR ADC circuit 300.

Figure 6B:
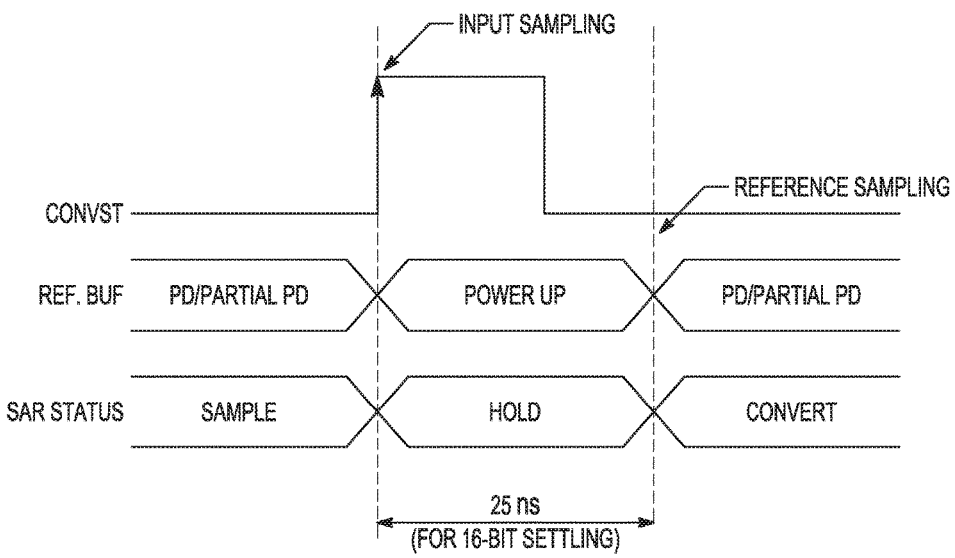
FIG. 6B shows a timing diagram corresponding to one example of a technique for operating the circuit arrangement shown in FIG. 6A.

FIG. 6B shows a timing diagram corresponding to one example of a technique for operating the circuit arrangement shown in FIG. 6A. During an initial period, with the signal Convst being low, the reference buffer circuit 602, the reference voltage generator circuit 100, or both, can be fully or partially powered-down, while the SAR ADC circuit 300 is sampling the analog input signal of interest at node 504 onto a capacitive digital-to-analog converter (CAPDAC) within the SAR ADC circuit 300. Then, at the time denoted "Input sampling" in FIG. 6B, a switch can be opened between the input node 504 and the SAR ADC circuit 300 to "Hold" the sample of the input signal of interest stored onto the CAPDAC within the SAR ADC circuit 300. During this "Hold" time shown in FIG. 6B, the reference buffer circuit 602 and the reference voltage generator circuit 100 can be powered up, such as explained herein. The time denoted "Reference sampling" in FIG. 6B can conclude a sampling onto the reservoir capacitor 302 of the reference voltage generated by the reference voltage circuit 100 and optionally buffered by the reference buffer circuit 602, such as by opening the switch 607. Then, the reference buffer circuit 602, the reference voltage generator circuit 100, or both, can be fully or partially powered-down, while the SAR ADC circuit 300 converts the sampled-and-held analog signal of interest into a digital signal, such as using bit trials in a successive approximation routine (SAR) conversion.

The above description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Geometric terms, such as "parallel", "perpendicular", "round", or "square", are not intended to require absolute mathematical precision, unless the context indicates otherwise. Instead, such geometric terms allow for variations due to manufacturing or equivalent functions. For example, if an element is described as "round" or "generally round," a component that is not precisely circular (e.g., one that is slightly oblong or is a many-sided polygon) is still encompassed by this description.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. A voltage reference circuit capable of being power-cycled for power efficiency and for transient recovery upon resuming operation, the voltage reference circuit including:
   an amplifier, including first and second input nodes, the amplifier configured to generate a reference voltage at an output node based on a temperature-compensated voltage provided by first and second transistors configured with an intentional mismatch to generate the temperature compensated voltage; and
   a capacitive feedback circuit configured to feed a portion of the reference voltage at the output node as a voltage difference across the first and second input nodes, wherein the capacitive feedback circuit includes a capacitive voltage divider.

2. The voltage reference circuit of claim 1, wherein the capacitive feedback circuit includes a capacitive voltage divider circuit between the output node and a ground reference node.

3. The voltage reference circuit of claim 2, wherein the capacitive voltage divider circuit includes first and second capacitors in series with each other and:
wherein the first capacitor includes a first terminal coupled to the output node and a second terminal coupled to an intermediate node and coupled to a first input of the amplifier; and
wherein the second capacitor includes a first terminal coupled to the intermediate node and a second terminal coupled to the ground reference node.

4. The voltage reference circuit of claim 3, comprising:
a first switch, across the first capacitor, that is off during a recurring operating cycle of the voltage reference circuit, and wherein the first switch is on during a recurrent power-down cycle of the voltage reference circuit; and
a second switch, across the second capacitor, that is off during the operating cycle of the voltage reference circuit, and wherein the second switch is on during the recurrent power-down cycle of the voltage reference circuit.

5. The voltage reference circuit of claim 4, wherein the amplifier includes a power-down switch that is on to allow power to be provided to the amplifier during the operating cycle and off to inhibit power to the amplifier during the recurrent power down cycle of the voltage reference circuit.

6. The voltage reference circuit of claim 1, in which the temperature compensated voltage is provided by a difference between different first and second FET threshold voltages.

7. The voltage reference circuit of claim 6, in which the amplifier includes first and second FETs respectively providing the different first and second reference voltages.

8. The voltage reference circuit of claim 6, in which the first and second FETs include different FET channel dopant densities.

9. The voltage reference of claim 6, in which the first and second FETs are arranged as a differential pair provided a current that is interruptable during a power-down cycle of the voltage reference circuit.

10. The voltage reference circuit of claim 9, wherein the second FET includes a gate terminal that is directly or indirectly electrically connected to a source/drain terminal of the second FET and that is electrically connected to the output node.

11. A voltage reference circuit capable of being power-cycled for power efficiency and for transient recovery upon resuming operation, the voltage reference circuit including:
an operational transconductance amplifier (OTA) including an output node providing a reference voltage based on a temperature-compensated voltage generated at an input of the amplifier;
a capacitive divider circuit between the output node and a ground or other reference node, with an intermediate node in the capacitive divider electrically coupled to an input of the amplifier; and
a switching network configured to initialize the capacitive divider circuit during a power-down cycle.

12. The voltage reference circuit of claim 11, wherein the switching network is configured to switchably connect the intermediate node to a specified initialization voltage during the power-down cycle.

13. The voltage reference circuit of claim 11, wherein the switching reference is configured to switchably connect the output node to a specified initialization voltage during the power down cycle.

14. The voltage reference circuit of claim 11, wherein the amplifier includes first and second FETs are source-coupled to each other and are electrically coupled to a current source or sink circuit.

15. The voltage reference circuit of claim 14, wherein the current source or sink circuit includes a native mode or depletion mode FET.

16. The voltage reference circuit of claim 11, wherein the amplifier includes first and second FETs having different threshold voltages to generate the temperature compensated voltage.

17. The voltage reference circuit of claim 16, wherein body terminals of the first and second FETs are connected to different nodes respectively biased at providing different voltages during an operating cycle of the voltage reference circuit.

18. A method of providing a voltage reference capable of being power-cycled for power efficiency and for transient recovery upon resuming operation, the method comprising:
generating a reference voltage based on a based on a temperature-compensated voltage;
providing capacitive feedback using a capacitor in a feedback path between an amplifier output and an amplifier inpput for use in the generating the reference voltage during an operating cycle of the voltage reference; and
initializing the capacitive feedback during a power-down cycle of the voltage reference.

19. The method of claim 18, further comprising connecting an intermediate node in the capacitive feedback to a specified initialization node voltage during the power-down cycle of the voltage reference.

20. The method of claim 18, wherein providing capacitive feedback includes biasing a differential pair of first and second FETs with an intermediate voltage of a capacitive divider during an operating cycle of the voltage reference.

21. The method of claim 18, further comprising generating the temperature-compensated voltage using first and second FETs having different threshold voltages.

22. The method of claim 18, comprising powering-down at least one of a reference voltage generator circuit or a reference voltage buffer circuit during a sampling of an analog signal of interest onto a capacitive digital-to-analog converter (CAPDAC) of an analog-to-digital converter (ADC) circuit.

23. The method of claim 19, comprising powering up at least one of a reference voltage generator circuit or a reference voltage buffer circuit during a hold phase following the sampling of the analog signal of interest.

24. The method of claim 23, comprising sampling a reference voltage or a buffered reference voltage onto a reservoir capacitor for use during successive approximation routine (SAR) bit trials and powering down at least one of the reference voltage generator circuit or the reference voltage buffer circuit during the SAR bit trials until a next SAR conversion of a subsequent sampled analog signal of interest.

25. The method of claim 18, in which generating a reference voltage based on a temperature-compensated voltage includes using an operational transconductance amplifier (OTA) circuit with the capacitive feedback arranged to generate the temperature compensated voltage as an input offset voltage at an input of the OTA circuit.

26. The method of claim 18, comprising dynamically bandlimiting the generating the reference voltage during the operating cycle of the voltage reference.

* * * * *